US006933748B2

(12) United States Patent
Hey-Shipton

(10) Patent No.: US 6,933,748 B2
(45) **Date of Patent: *Aug. 23, 2005**

(54) FILTER NETWORK COMBINING NON-SUPERCONDUCTING AND SUPERCONDUCTING FILTERS

(75) Inventor: Gregory L. Hey-Shipton, Santa Barbara, CA (US)

(73) Assignee: Superconductor Technologies, Inc., Santa Barbara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/430,914

(22) Filed: May 6, 2003

(65) Prior Publication Data

US 2003/0206078 A1 Nov. 6, 2003

Related U.S. Application Data

(63) Continuation of application No. 09/818,100, filed on Mar. 26, 2001, now Pat. No. 6,686,811.

(51) Int. Cl.[7] .................... H03K 19/21
(52) U.S. Cl. .................... 326/54; 333/202; 455/561
(58) Field of Search .................... 326/53; 333/99 S, 333/202, 134; 455/561, 14

(56) References Cited

U.S. PATENT DOCUMENTS

| | | | | |
|---|---|---|---|---|
| 3,731,759 A | | 5/1973 | Carlson | |
| 5,244,869 A | | 9/1993 | Billing | |
| 5,894,250 A | | 4/1999 | Ravaska et al. | |
| 6,212,404 B1 | * | 4/2001 | Hershtig | 455/561 |
| 6,263,215 B1 | | 7/2001 | Patton et al. | |
| 6,317,003 B1 | | 11/2001 | Kobayashi | |
| 6,686,811 B2 | * | 2/2004 | Hey-Shipton | 333/202 |
| 2001/0038320 A1 | | 11/2001 | Abdelmonem | |
| 2001/0055960 A1 | | 12/2001 | Abdelmonem | 455/307 |
| 2002/0130730 A1 | | 9/2002 | Abdelmonem | 333/99 |
| 2002/0132591 A1 | | 9/2002 | Abdelmonem | 455/78 |

OTHER PUBLICATIONS

Kurzrok, R., RCA Commun. Systems Lab, General Three–Resonator Filters in Waveguide, IEEE Transactions on Microwave Theory and Techniques, pp. 46 and 47, undated.

Pftzenmaier, G., Synthesis and Realization of Narrow–Band Canonical Microwave Bandpass Filters Exhibiting Linear Phase and Transmission Zeros, IEEE Transactions on Microwave Theory and Techniques, vol. MTT–30, No. 9, Sept. 1982; pp. 1300–1311.

Matthaei, G.L., Design of HTS, Lumped–Element, Manifold–Type Microwave Multiplexers; IEEE Transactions on Microwave Theory & Techniques, vol. 44, No. 7, Jul. 1996.

* cited by examiner

*Primary Examiner*—Michael Tokar
*Assistant Examiner*—Lam T. Mai
(74) *Attorney, Agent, or Firm*—O'Melveny & Myers LLP

(57) ABSTRACT

A filter network designed for providing high frequency selectivity with a high degree of reliability and availability. The filter network comprises a superconducting filter and a non-superconducting filter, or a combination thereof to form multiplexers. A receive side of the non-superconducting filter pre-filters received RF signals before inputting them to the superconducting filter. The non-superconducting filter is constructed and arranged to pass RF signals having a frequency within a first pass band to the superconducting filter. The superconducting device is constructed and arranged to exhibit a high-degree of frequency selectivity in further narrowing the received RF signals. Other aspects are directed to the arrangement, construction, and uses of the same structures to accomplish different but similar goals. In a multiplexed configuration, various combinations of transmit filters are used to enable the use of a common antenna with the receive side electronics, which may be located at the top of the antenna tower or in the base station.

21 Claims, 6 Drawing Sheets

FILTER NETWORK COMBINING NON-SUPERCONDUCTING AND SUPERCONDUCTING FILTERS

CROSS-REFERENCE TO RELATED APPLICATIONS

This application is a continuation of U.S. application Ser. No. 09/818,100, filed Mar. 26, 2001 now U.S. Pat. No. 6,686,811, allowed, which is fully and expressly incorporated by reference herein.

FIELD OF THE INVENTION

The present invention relates generally to structures and techniques for filtering radio waves and more particularly to the implementation of a filter network using a combination of superconducting filters and non-superconducting filters.

BACKGROUND OF THE INVENTION

Radio frequency (RF) equipment have used a variety of approaches and structures for receiving and transmitting radio waves in selected frequency bands. The type of filtering structure used often depends upon the intended use and the specifications for the radio equipment. For example, dielectric filters may be used for filtering electromagnetic energy in the ultra-high frequency (UHF) band, such as those used for cellular communications in the 800+ MHz frequency range. Typically, such filter structures are implemented by coupling a number of dielectric resonator structures together. One can also use metal coaxial resonators in such filters are coupled together via capacitors, inductors, or by apertures in walls separating the resonator structures. The number of resonator structures used for any particular application also depends upon the system specifications and, typically, added performance is realized by increasing the number of intercoupled resonator structures.

However, because of an increase in the number of users utilizing a limited bandwidth, demand has increased for greater frequency selectivity than can be provided by normal or non-superconducting resonator filters, especially for RF signals in the ultra-high frequency bands used for cellular communications. High frequency selectivity has previously been accomplished using High Temperature Superconducting (HTS) filters, usually as front-end filters for cellular base station receivers. However, HTS front-end filters may be susceptible to failure, or degradation in performance, induced by lightning surges or other high power signals. In addition, the non-linearity of HTS filters produces in-band intermodulation spurious signals from out-of-band interferers.

For cellular or similar base stations, typical lightning protectors have only one resonator and do not provide sufficient protection from high power co-located radio frequency signals originating from the transmit side of the base stations. These co-located transmission signals are especially troublesome because they are relatively closely spaced to the operating frequency of the base station receivers. Accordingly, there is a need for a filter that overcomes the above-mentioned and other disadvantages associated with the prior art.

SUMMARY OF THE INVENTION

The present invention is directed toward a filter network that provides high frequency selectivity to a receiver. The filter network of the present invention comprises a non-superconducting filter and a superconducting filter. The output of the non-superconducting filter is coupled to the input of a superconducting filter. The non-superconducting filter pre-filters received RF signals by passing RF signals having a frequency within a first pass band to the superconducting filter. The superconducting filter further filters the RF signals to provide a high degree of frequency selectivity at its output.

The filter network of the present invention is able to provide high frequency selectivity while overcoming many of the disadvantages associated with superconducting filters. This is achieved by pre-filtering the RF signals with the non-superconducting filter before inputting them to the superconducting filter. The non-superconducting filter protects the superconducting filter from lightning surges or other high power signals. In addition, the non-superconducting filter filters out interferers that produce in-band intermodulation spurious signals at the superconducting filter output. In a multiplexed configuration, the non-superconducting filter protects the superconducting filter directly from transmit signal energy.

According to one embodiment of the present invention, the non-superconducting resonator filter comprises a housing enclosing three resonators. The resonators are coupled to each other through apertures in the housing. The effect of using this coupling with the three resonators is to produce a filter response with a pass band and a finite frequency transmission zero located outside the pass band.

BRIEF DESCRIPTION OF THE DRAWINGS

Other aspects and advantages of the invention will become apparent upon reading the following detailed description and upon reference to the drawings in which.

DETAILED DESCRIPTION

The present invention is believed to be applicable to a variety of radio frequency (RF) applications in which achieving low insertion loss in the pass band with high attenuation in the stop band, and an extremely high degree of selectivity in the pass band are necessary. The present invention is particularly applicable and beneficial for cellular-communication base stations, and other communication applications. While the present invention is not so limited, an appreciation of the present invention is best presented by way of a particular example application, in this instance, in the context of such a communication system.

Figure 1:
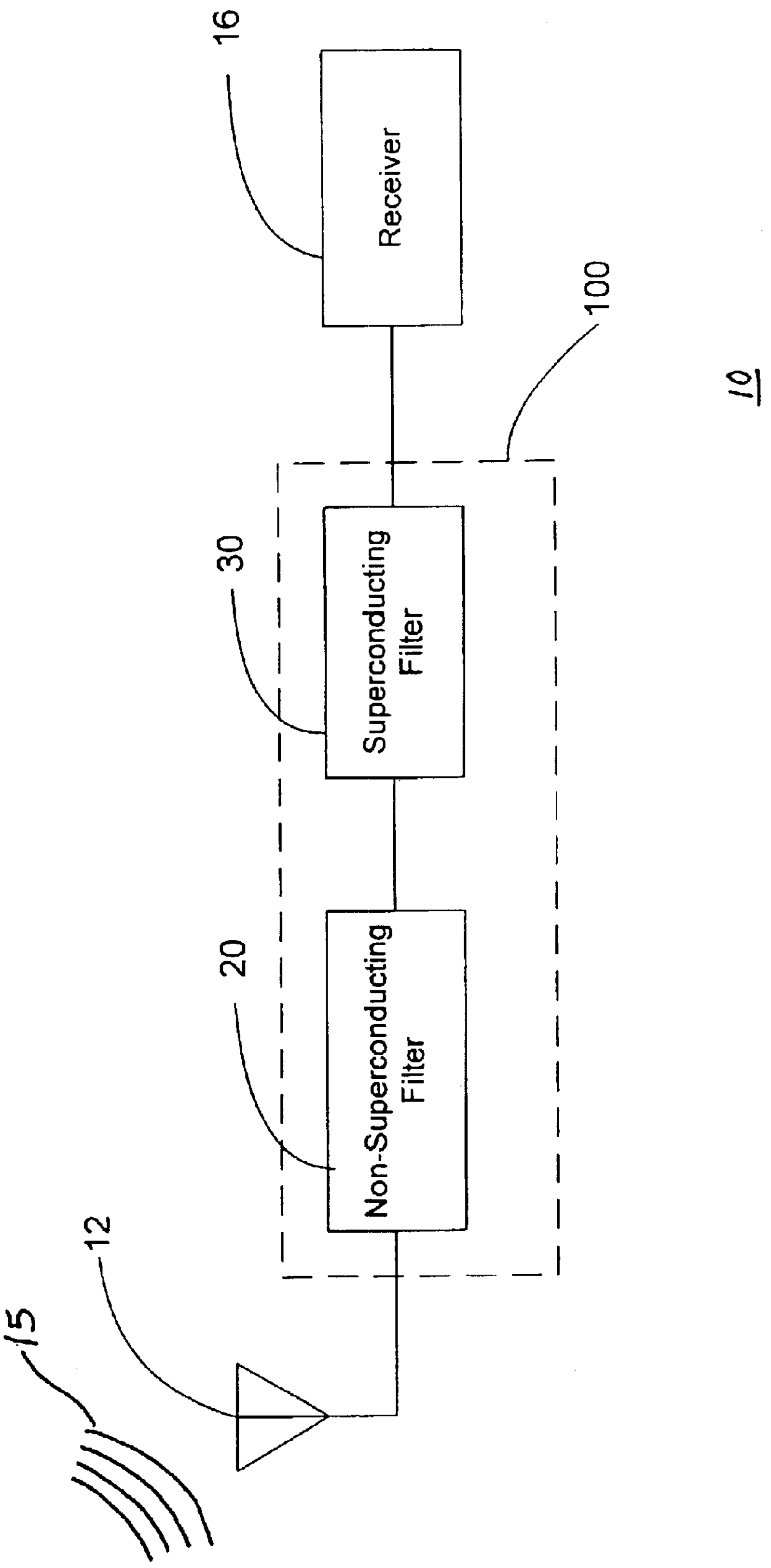
FIG. 1 shows a communications system incorporating a filter network according to one embodiment of the invention.

Now turning to the drawings, FIG. 1 shows a front-end receiver system 10 of a base station, according to a particular application and embodiment of the present invention. The front-end receiver system 10 includes an antenna 12 for receiving RF signals 15, a filter network 100 for filtering the received RF signals, and a receiver 16. The filter network 100 is used to selectively pass received RF signals within a designated pass band to the receiver 16, while filtering out interferers. The interferers are interfering signals located outside the operating frequency of the receiver 16, and include RF signals transmitted by other cellular service providers. The interferers also include co-located transmission signals transmitted by the transmitter side of the same base station.

The filter network 100 comprises a non-superconducting filter 20 and a superconducting filter 30, preferable a High Temperature Superconducting (HTS) filter. The input of the non-superconducting filter 20 receives RF signals 15 from the antenna 12. The output of the non-superconducting filter 20 is coupled to the input of the superconducting filter 30, and the output of the superconducting filter is coupled to the receiver 16. The non-superconducting filter 20 pre-filters the received RF signals 15 before they are filtered by the superconducting filter 30.

The non-superconducting filter 20 is a bandpass filter tuned to pass the received RF signals having a frequency within a first pass band to the superconducting filter 30. Preferably, the first pass band encompasses a receiving frequency range of the base station. For base stations using the Advanced Mobile Phone Service (AMPS) standard, for example, the total receiving frequency range is approximately 824 MHz to 849 MHz. The superconducting filter 30 is a bandpass filter tuned to pass the pre-filtered RF signals having a frequency within a second pass band to the receiver 16. The second pass band is a narrow pass band located inside the first pass band for providing high frequency selectivity to the receiver 16.

The non-superconducting filter 20 protects the superconducting filter 30 from high power out-of-band signals that can cause catastrophic failure of the superconducting filter 30. The high power signals include electrical surges caused by lightning strikes. In addition, the non-superconducting 20 filter filters out interferers located outside the first pass band before they are inputted to the superconducting filter 30. This is done because these interferers produce in-band intermodulation spurious signals in the superconducting filter 30. By filtering out these interferers before they are inputted to the superconducting filter 30, the non-superconducting filter 20 dramatically reduces the in-band intermodulation spurious signals.

The superconducting filter 30 provides high frequency selectivity to the receiver 16 for rejecting undesirable signals that are closely spaced in frequency to desirable signals. The advantage of using a superconducting filter is its ability to provide a precise narrow pass band around the desired signals with low insertion loss due to its low resistance. This allows the superconducting filter 30 to provide high frequency selectivity without adversely affecting the signal sensitivity of the receiver 16.

Therefore, the filter network 100 according to the present invention exhibits high frequency selectively and low insertion loss without many of the disadvantages associated with a superconducting filter. This is achieved by pre-filtering the RF signals with the non-superconducting filter 20 before inputting the RF signals to the superconducting filter 30. That way, catastrophic failure due to high power out-of-band signals and performance degradation due to in-band intermodulation spurious signals are dramatically reduced.

Figure 2B:
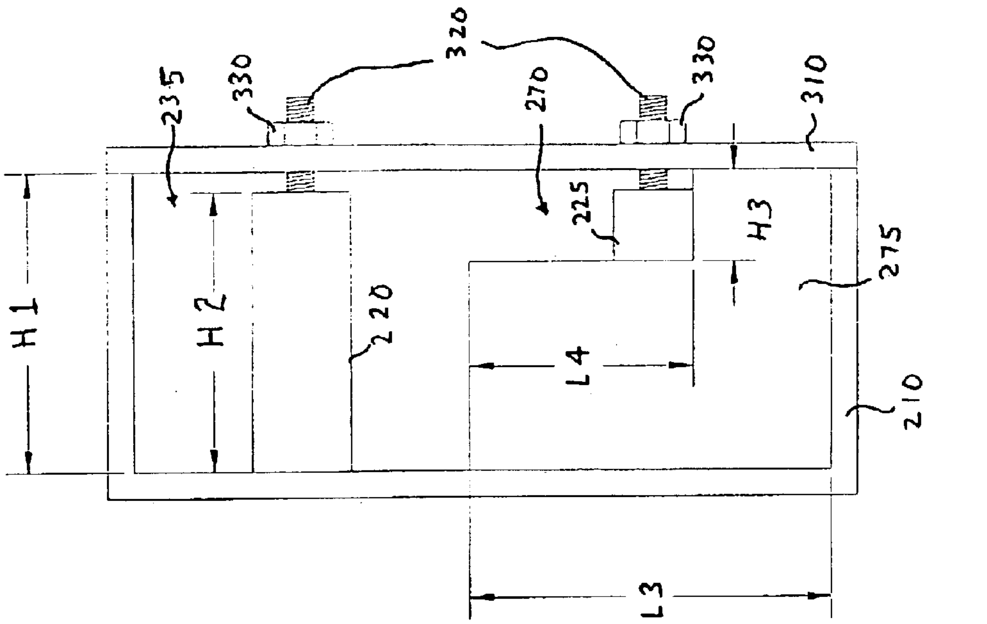
FIG. 2B shows a cross-sectional side view of the non-superconducting filter according to one embodiment of the present invention.
Figure 2A:
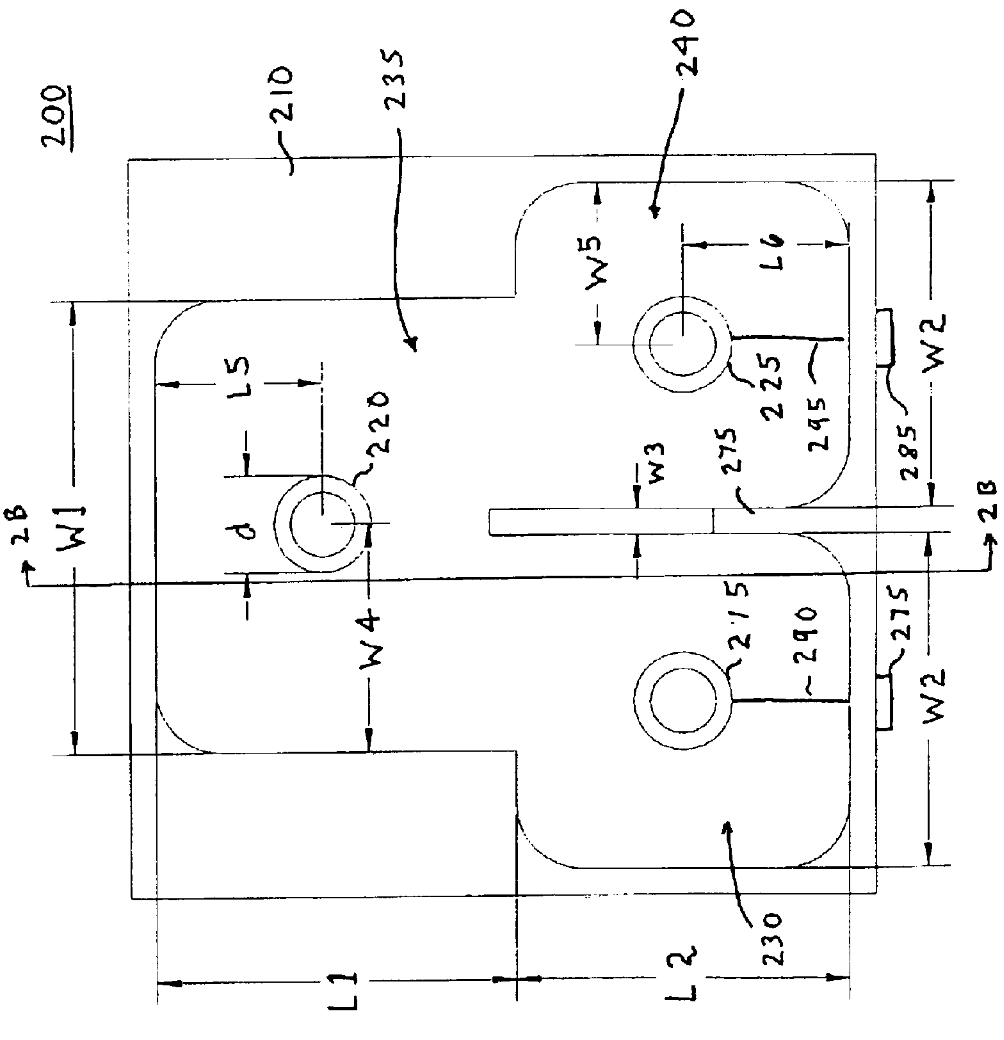
FIG. 2A shows a top view of a non-superconducting filter according to one embodiment of the present invention.

FIG. 2A of a non-superconducting filter 200 according to one embodiment of the present invention. The non-superconducting filter 200 comprises a housing 210 enclosing three round-rod resonators 215, 220 and 225. Alternatively, the resonators 215, 220 and 225 can be waveguide resonators, cavity resonators, dielectric resonators, stripline resonators, or other resonators known in the art. The housing 210 and resonators 215, 220 and 225 may be machined from aluminum and silver plated to minimize insertion loss. The resonators 215, 220 and 225 are placed in three cavities 230, 235, and 240, respectively, formed inside the housing 210, creating coaxially resonant structures. The input 275 and the output 285 of the non-superconducting 200 filter are directly coupled 290 and 295 to resonators 215 and 225, respectively. Alternatively, the input 275 and the output 285 may be coupled to the resonators 215 and 225, respectively, using capacitors, inductors or any other coupling technique used by those skilled in the art.

FIG. 2B shows a cross-sectional view of the non-superconducting filter 200 taken along line 2B in FIG. 2A. FIG. 2B shows a top plate 310 placed over the housing 210 of the non-superconducting filter 200. In addition, tuning screws 320 are inserted into each resonator 215, 220 and 225 though the top plate 310. The tuning screws 320 are secured to the top plate 310 by nuts 330. The functionality of the tuning screws 320 will be discussed later.

Each resonator 215, 220 and 225 is electro-magnetically coupled to each one of the other two resonators 215, 220 and 225 through apertures in the housing 210. The aperture coupling resonators 215 and 220 is shown in FIG. 2A as the opening between cavities 230 and 235. The aperture coupling resonators 220 and 225 is shown in FIG. 2A as the opening between cavities 235 and 240. The aperture coupling resonators 215 and 225 is best shown in FIG. 2B as an opening 270 in a housing wall 275 positioned between resonators 215 and 225. Alternatively, the resonators can be coupled to each other using transformers or capacitors.

The turning screws 320 are used to adjust the capacitance of the resonators 215, 220 and 225. Turning the tuning screws 320 inwardly increases the capacitance of the resonators 215, 220 and 225, which lowers the resonance frequency of the resonators 215, 220 and 225. Turning the tuning screws 320 outwardly decreases the capacitance of the resonators, which increases the resonance frequency of the resonators 215, 220 and 225.

The non-superconducting filter 200 of FIGS. 2A and 2B produces a first pass band and a finite frequency transmission zero positioned at a frequency outside the first pass band. The finite frequency transmission zero provides enhanced rejection of signals located in its vicinity. The position of the finite frequency transmission zero can be controlled by adjusting the dimensions of the aperture coupling resonators 215 and 225. Preferably, the finite frequency transmission zero is positioned at a frequency within a frequency range containing powerful interferers to provide enhanced rejection of these interferers. For example, the co-located transmission signals transmitted by the transmitter side of the base station can be powerful due to the proximity between the transmitter and receiver side of the base station. In this example, the finite frequency transmission zero can be positioned at a frequency inside the transmitting frequency range of the base station to enhance rejection of the co-located transmission signals. For base stations using the AMPS standard, for example, the transmitting frequency range is approximately 869 MHz to 894 MHz, which is located near the receiving frequency range of 824 MHz to 849 MHz. The finite frequency transmission zero can be positioned at a frequency either above or below the first pass band, depending on the location of powerful interferers.

In one specific example of the non-superconducting filter 200 in FIGS. 2A and 2B, the non-superconducting filter 200 structure has the dimensions given below. The housing 210 has a height H1 of 2.30 inches. Chamber 235 has a width W1 of 3.50 inches and a length L1 of 2.75 inches, and chambers 230 and 240 each have a width W2 of 2.55 inches and a length L2 of 2.55 inches. Each one of the resonators 215, 220 and 225 has a diameter d of 0.75 inches and a height H2 of 2.15 inches. The center of resonator 220 is positioned in chamber 235 a length L5 of 1.275 inches from one side of the housing 210 and width W4 of 1.75 from another side of the housing 210. The center of resonator 225 is position in chamber 240 a length L6 of 1.275 inches from one side of the housing 210 and a width W5 of 1.275 from another side of the housing 210. The center of resonator 215 is in the same relative position in chamber 230 as the center of resonator 235 is in chamber 240. The housing wall 275 separating resonators 215 and 225 has a width W3 of 0.20 inches and a length L3 of 2.75 inches. Finally, the aperture 270 coupling resonators 215 and 225 has a height H3 of 0.70 inches and a length L4 of 1.70 inches.

Figure 3:
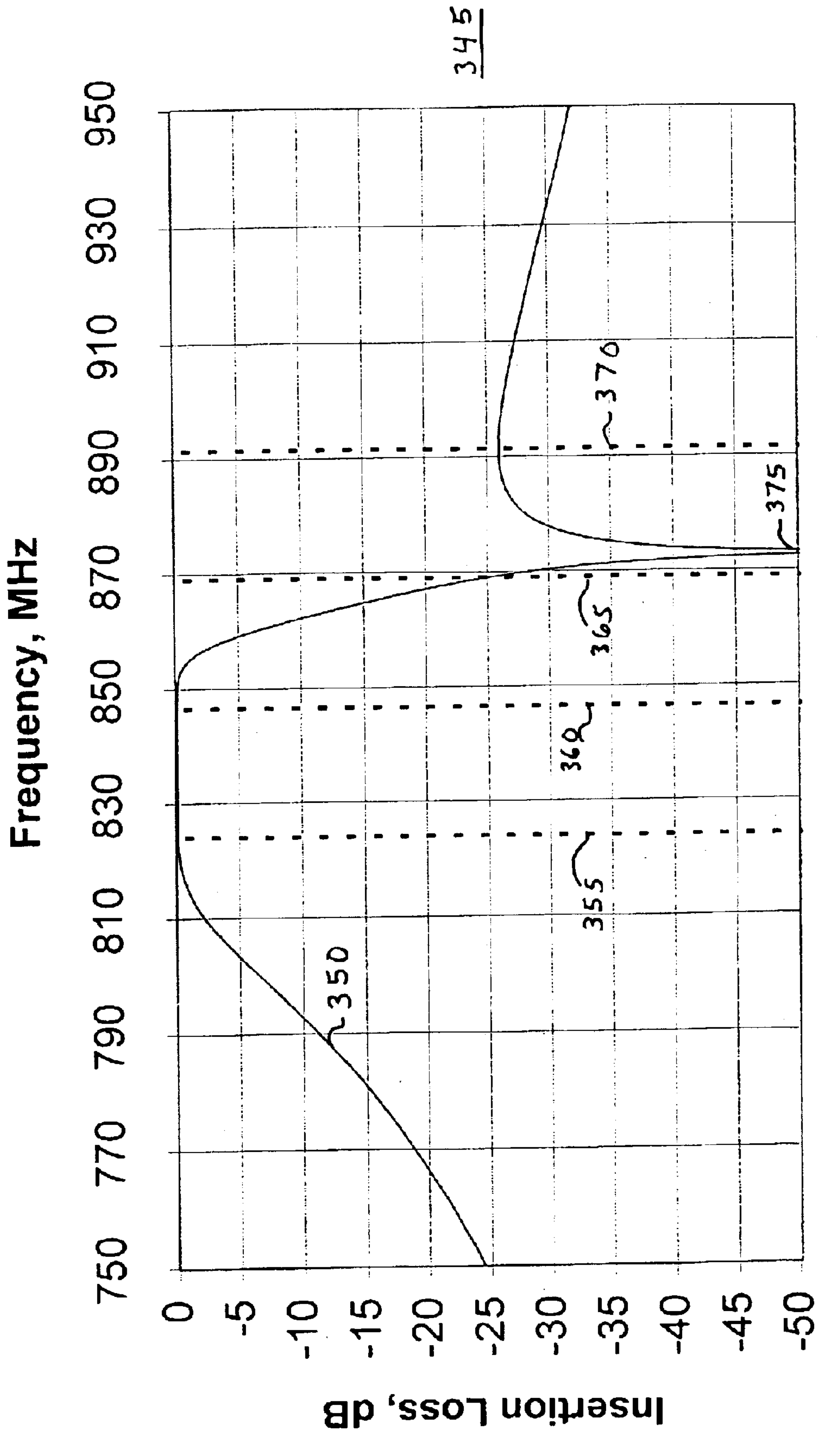
FIG. 3 shows a plot of the filter response of the non-superconducting filter according to one embodiment of the present invention.

FIG. 3 shows a plot 345 of the frequency response of a non-superconducting filter 200 made from silver-plated aluminum and having the above dimensions. Specifically, the plot 345 shows an insertion loss 350 measured in decibels (dB) between the input 275 and the output 285 of the non-superconducting filter 200 versus frequency in the range of 750 MHz to 950 MHz. The filter 200 passes frequencies at which the insertion loss 350 is low and rejects frequencies at which the insertion loss 350 is high. In FIG. 3, the insertion loss 350 is low within a receiving frequency range of about 824 MHz to 849 MHz, which is bounded by lines 355 and 360. In contrast, the insertion loss is high within a transmitting frequency range of 869 MHz to 894 MHz, which is bounded by lines 365 and 370. Thus, the non-superconducting filter 200 measured in plot 345 passes signals within the receiving frequency range of 824 MHz to 849 MHz, while rejecting signals within the transmitting frequency range of 869 MHz to 894 MHz. These frequency ranges correspond to the receiving and transmitting frequency ranges used by cellular base stations in the AMPS standard.

In this specific example, the effect of the cross coupling between the resonators 215, 220 and 225 produces a finite frequency transmission zero, which can been seen as a deep spike 375 in the insertion loss 350 in the plot 345. This transmission zero is located inside the base station transmitting frequency range of 869 MHz to 894 MHz and provides enhanced rejection of frequencies within this frequency range.

Figure 4:
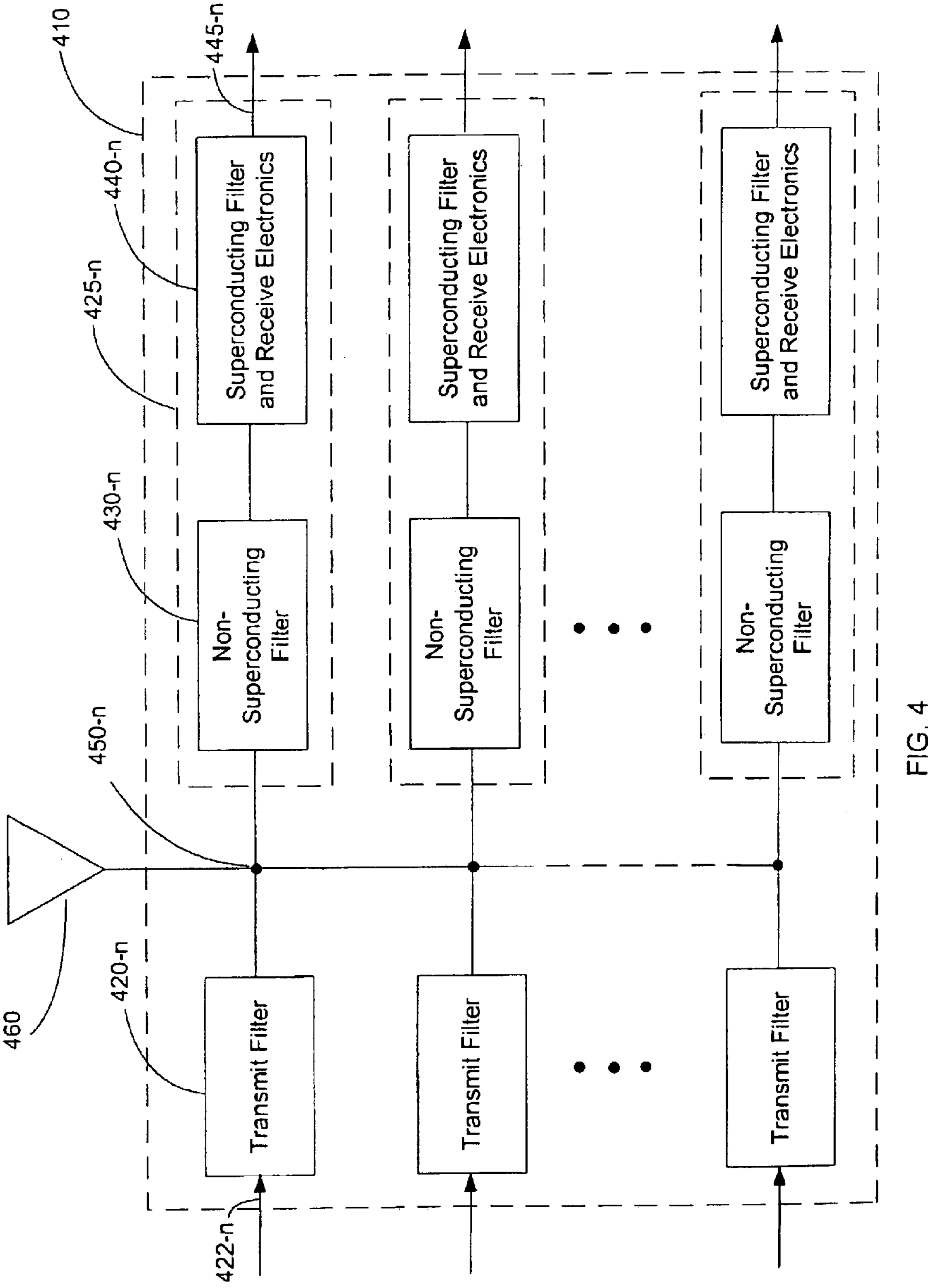
FIG. 4 shows a multiplexer according to one embodiment of the present invention.

FIG. 4 shows a multiplexer 410 according to one embodiment of the present invention. The multiplexer 410 comprises at least one transmit filter 420-*n* and at least one receive filter network 425-*n*. The receive filter network 425-*n* further comprises a non-superconducting filter 430-*n*, and a superconducting filter and receive electronics 440-*n*. The output of the transmit filter 420-*n* and the input of the receive filter network 425-*n* are coupled to a common antenna port 450-*n*. The transmit filter 420-*n* and the receive filter network 425-*n* may be coupled to the common antenna port 450-*n* by an interconnecting phasing network (not shown), the construction of which is well known in the art. The common antenna port 450-*n* is coupled to an antenna 460, for example, through a cable. The multiplexer 410 may be located in close proximity to the antenna 460. For example, the multiplexer 410 and the antenna 460 may be mounted to the same antenna tower. Alternatively, the multiplexer 410 may be located away from the antenna 460, such as in a base station.

The transmit filter 420-*n* filters incoming transmit signals 422-*n* from the transmitter side of a base station (not shown). The transmit filter 420-*n* is a bandpass filter constructed to pass signals within a transmitting frequency range of the base station, for example, approximately 869 MHz to 894 MHz for the AMPS standard. The transmit filter 420-*n* may include one or more finite frequency transmission zeros for providing enhanced rejection of signals located outside of the transmitting frequency range, such as the receive signals on the common antenna port 450-*n*. The non-superconducting filter 430-*n* of the receive filter network 425-*n* pre-filters receive signals from the antenna 460. The non-superconducting filter 430-*n* is a bandpass filter constructed to pass signals within a receiving frequency range of the base station, for example, 824 MHz to 849 MHz for the AMPS standard. The non-superconducting filter 430*n* may include one or more finite frequency transmission zeros for providing enhanced rejection of signals located outside of the receiving frequency range, such as the transmit signals on the common antenna port 450-*n*. The superconducting filter 440-*n* is a sharp bandpass filter for providing high frequency selectivity of the receive signals. The receive electronics 440-*n* further processes the receive signals. The receive electronics 440-*n* may include a Low Noise Amplifier (LNA), which may or may not be cryogenically cooled, for amplifying the receive signals. The receive electronics 440-*n* may also include protection circuits for protecting the superconducting filter 440-*n* and/or base station (not shown) from electrical surges. The protection circuits may include gas discharge tube voltage arrestors, quarter wavelength stubs, and any other protection circuits that are well known in the art. The receive signals are outputted 445-*n* by the receive filter network 425-*n* to the receiver side of a base station (not shown).

The multiplexer 410 according to the present invention enables the same antenna 460 to both transmit and receive signals, thereby reducing costs. This is achieved by coupling the transmit filter 420-*n* and the receive filter network 425-*n* to the common antenna port 450-*n* of the multiplexer 410, and coupling the common antenna port 450-*n* to the antenna 460.

Figure 5:
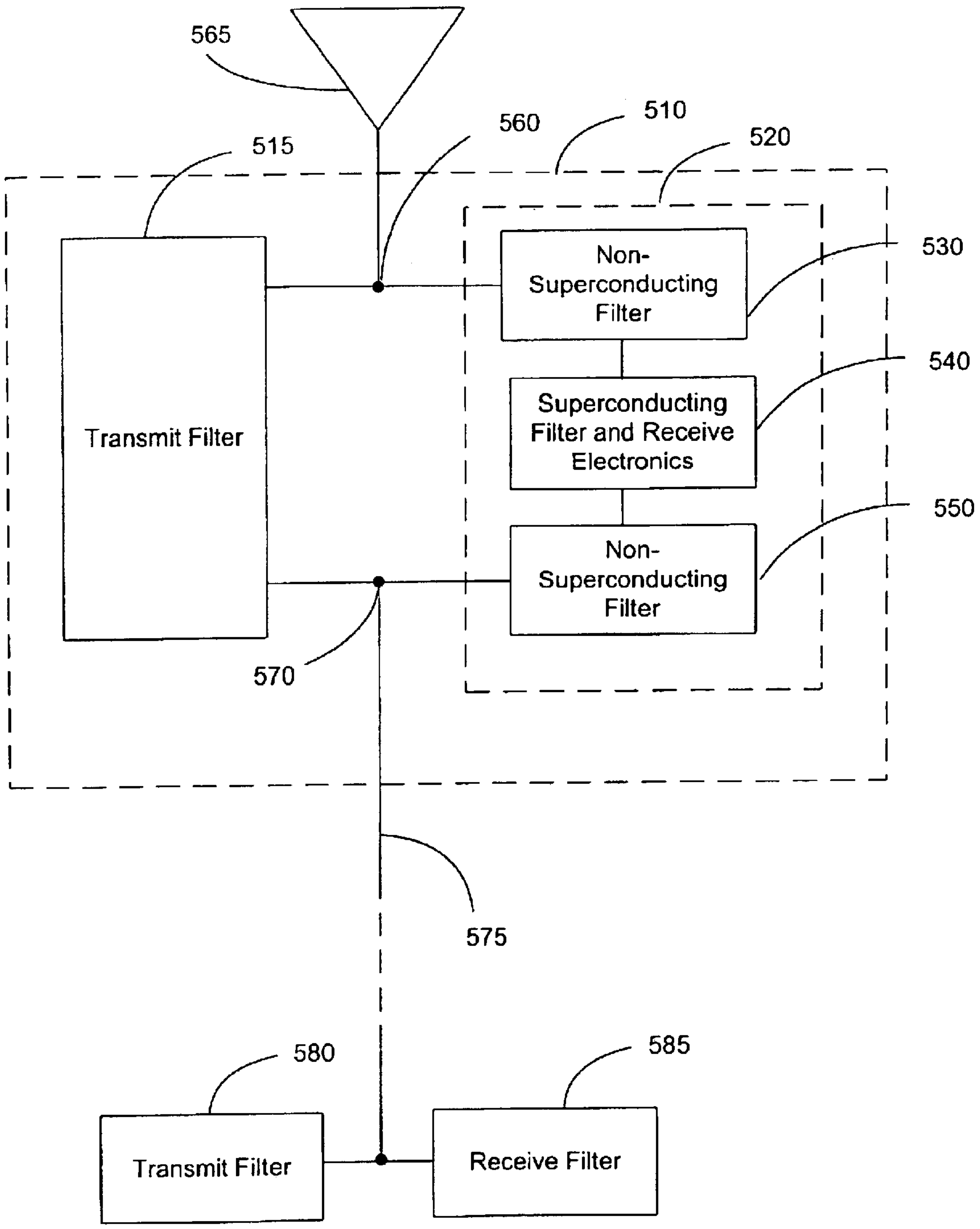
FIG. 5 shows a double-duplexer according to one embodiment of the present invention.

FIG. 5 shows a double duplexer 510 according to another embodiment of the present invention. The double duplexer 510 includes a transmit filter 515 and a receive filter network 520. The receive filter network 520 further includes a first non-superconducting filter 530, a second non-superconducting filter 550, and a superconducting filter and receive electronics 540 coupled between the first and second non-superconducting filter 530, 550. The output of the transmit filter 515 and the input of the receive filter network 520 are coupled to a common antenna port 560. The common antenna port 560 is coupled to an antenna 565, for example, through a cable. The input of the transmit filter 515 and the output of the receive filter network 520 are coupled to a common port 570. The common port 570 is coupled to a base station (not shown) through a cable 575.

The transmit filter 515 filters incoming transmit signals from the base station (not shown) in a manner similar to the transmit filter 420-*n* of the multiplexer 410. The first non-superconducting filter 530 pre-filters receive signals from the antenna 565 in a manner similar to the non-superconducting filter 430 of the multiplexer 410. The superconducting filter 540 is a sharp bandpass filter for providing high frequency selectivity of the receive signals. The receive electronics 540 further processes the receive signal in a manner similar to the receive electronics 440-*n* of the multiplexer 410. The second non-superconducting filter 550 is a bandpass filter that passes the receive signals to the common port 570 while blocking the transmit signals on the common port 570 from the entering the receive electronics 540. The second non-superconducting filter 550 may be the identical to the first non-superconducting filter 530.

The double-duplexer 510 according to the present invention enables the same antenna 565 to both transmit and receive signals, thereby reducing costs. In addition, the double-duplexer 510 enables the transmit signals and the receive signals to flow between the double-duplexer 510 and the base station (not shown) through the common port 570. As a result, a single cable 575 can be used to coupled the double-duplexer 510 to the base station. Because the base station uses a single cable 575 to both transmit signals to and receive signals from the double-duplexer 510, additional filters may be needed to split the transmit and receive signals at the base station. This may be accomplished by providing a transmit filter 580 between the transmitter side of the base station (not shown) and the cable 575, and a receive filter 585 between the receiver side of the base station (not shown) and the cable 575.

Although, the double-duplexer 510 was described as including one transmit filter 515 and one receive filter network 520, those skilled in the art will appreciate that any number of transmit filters and receive filter network may be added to the double-duplexer to realize a double-multiplexer.

Figure 6:
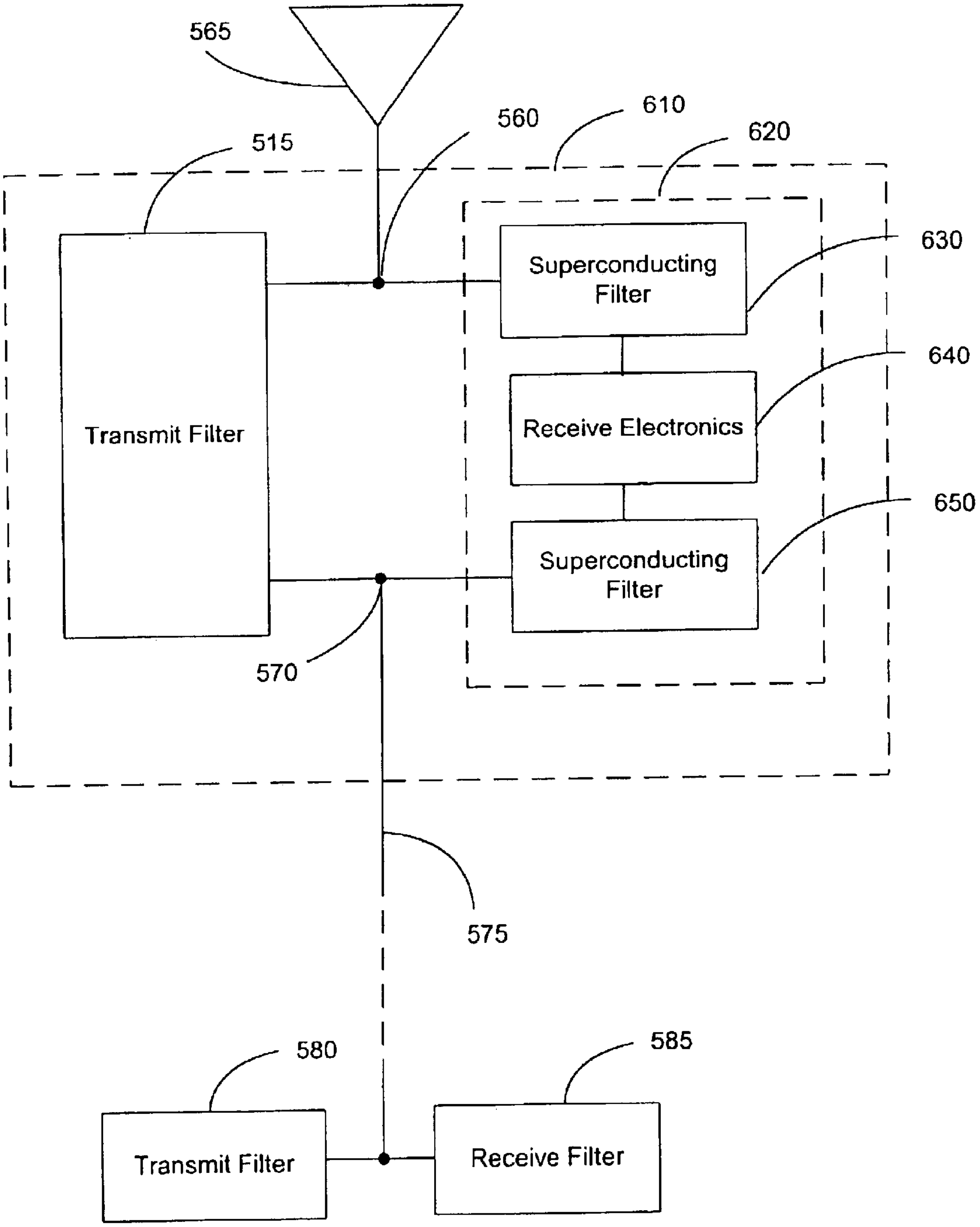
FIG. 6 shows a double-duplexer according to another embodiment of the present invention.

FIG. 6 shows a double-duplexer 610 according to another embodiment of the present invention. In this embodiment, the receive filter network 620 includes a first superconducting filter 630, a second superconducting filter 650, and receive electronics 640 coupled between the first and second superconducting filter 630, 650. The first superconducting filter 630 is a sharp bandpass filter for providing high frequency selectivity of the receive signals from the antenna 565. The receive electronics 630 further processes the receive signals and may include an LNA and protection circuits. The second superconducting filter 650 is a bandpass filter that passes the receive signals to the common port 570 while blocking transmit signals on the common port 570 from entering the receive electronics 640. Alternatively, the second superconducting filter 650 may be replaced by a non-superconducting filter.

Additionally, to alleviate catastrophic failure of the receive side of the systems shown in FIGS. 4 and 5, a switched bypass (not shown) may be used. In the event of an electrical surge in a receive path of the systems, the switched bypass directs the receive signals around the superconducting filters shown in the receive electronics 440-*n* and 540. Also included in this bypass function may be one or more low noise amplifiers, which may or may not be cooled, along with any other circuitry in the path of the receive signals that may be considered prone to failure.

Other aspects and embodiments of the present invention will be apparent to those skilled in the art from consideration of the specification and practice of the invention disclosed herein. For example, the non-superconducting filter illustrated in FIGS. 2A and 2B may be implemented in a variety of ways to achieve similar results according to the design and specifications. In addition, those skilled in the art will appreciate that the invention is not restricted to frequency bands used in the AMPS standard, and may, in principle, operate in other frequency bands used in other mobile phone standards. It is intended that the specification and illustrated embodiments be considered as exemplary only, with a true scope and spirit of the invention being indicated by the following claims.

What is claimed is:

1. A filter network, comprising:

a non-superconducting filter, wherein the non-superconducting filter is a bandpass filter having a first pass band, an input, and an output; and a superconducting filter, wherein the superconducting filter is a bandpass filter having a second pass band located inside the first pass band, said superconducting filter having an input coupled to the output of the non-superconducting filter.

2. A method of filtering radio frequency (RF) signals, comprising the steps of:

filtering RF signals using a non-superconducting filter by passing the RF signals having a frequency within a first pass band; and subsequently filtering the RF signals using a superconducting filter.

3. The method of claim 2, wherein the step of filtering the RF signals using the non-superconducting filter further comprises the step of providing a finite transmission zero at a frequency outside the first pass band for enhancing signal rejection.

4. A front-end receiver system for use in a base station, comprising:

a non-superconducting filter, wherein the non-superconducting filter is a bandpass filter having a first pass band encompassing a receiving frequency range of the base station of approximately 824 MHz to 849 MHz, an input for receiving RF signals, and an output;

a superconducting filter, said superconducting filter having an input coupled to the output of the non-superconducting filter, and an output; and a receiver coupled to the output of the superconducting filter.

5. The system of claim 4, wherein the non-superconducting filter has a finite frequency transmission zero positioned at a frequency outside the first pass band and the finite frequency transmission zero is positioned at a frequency within a transmitting frequency range of the base station.

6. The system of claim 5, wherein the transmitting frequency range of the base station is approximately 869 MHz to 894 MHz.

7. The system of claim 4, wherein the superconducting filter is a bandpass filter having a second pass band located inside the first pass band.

8. A front-end receiver system for use in a base station, comprising:

a bandpass non-superconducting filter, said non-superconducting filter having a first pass band encompassing a receiving frequency range of the base station, a finite frequency transmission zero located at a frequency within a transmitting frequency range of the base station, an input for receiving RF signals, and an output; and a bandpass superconducting filter, said superconducting filter having a second pass band located inside the first pass band, an input coupled to the output of the non-superconducting filter, and an output.

9. A filter network, comprising:

a non-superconducting filter, said non-superconducting filter having an input, an output, a housing, a first resonator, a second resonator, and a third resonator, said resonators being enclosed in the housing such that the input of the non-superconducting filter is coupled to the first resonator, the output of the non-superconducting filter is coupled to the third resonator, and each resonator is coupled to each one of the other two resonators, wherein the non-superconducting filter is a bandpass filter having a first pass band; and a superconducting filter, said superconducting filter having an input coupled to the output of the non-superconducting filter.

10. The filter network of claim 9, wherein the non-superconducting filter has a finite frequency transmission zero positioned at a frequency outside of the first pass band.

11. The filter network of claim 10, wherein the finite frequency transmission zero is positioned at a frequency above the first pass band.

12. The filter network of claim 9, wherein the finite frequency transmission zero is positioned at a frequency below the first pass band.

13. The filter network of claim 9, wherein the superconducting filter is a bandpass filter having a second pass band located inside the first pass band.

14. The filter network of claim 9, wherein the input and the output of the non-superconducting filter are directly coupled to the first and third resonator, respectively.

15. The filter network of claim 9, wherein the input and the output of the non-superconducting filter are directly coupled to the first and third resonator, respectively.

16. The filter network of claim 9, wherein the resonators are coupled to one another through apertures in the housing.

17. A filter network, comprising:

a non-superconducting filter, said non-superconducting filter having an input, an output, a housing, and more than three resonators, said resonators being enclosed in the housing such that the input of the non-superconducting filter is coupled to one of the resonators, and the output of the non-superconducting filter is coupled to another one of the resonators, wherein the non-superconducting filter is a bandpass filter having a first pass band; and a superconducting filter, said superconducting filter having an input coupled to the output of the non-superconducting filter.

18. A method of filtering radio frequency (RF) signals, comprising the steps of:

filtering RF signals using a non-superconducting filter by passing the RF signals having a frequency within a first pass band; and subsequently filtering the RF signals using a superconducting filter by passing the RF signals having a frequency within a second pass band, said second pass band being located inside the first pass band.

19. A front-end receiver system for use in a base station, comprising:

a non-superconducting filter, said non-superconducting filter having an input for receiving RF signals, an output, a housing, a first resonator, a second resonator, and a third resonator, said resonators being enclosed in the housing such that the input of the non-superconducting filter is coupled to the first resonator, the output of the non-superconducting filter is coupled to the third resonator, and each resonator is coupled to each one of the other two resonators, wherein the non-superconducting filter is a bandpass filter having a first pass band;

a superconducting filter, said superconducting filter having an input coupled to the output of the non-superconducting filter, and an output; and a receiver coupled to the output of the superconducting filter.

20. The system of claim 19, wherein the non-superconducting filter has a finite frequency transmission zero positioned at a frequency outside the first pass band.

21. A front-end receiver system for use in a base station, comprising:

a non-superconducting filter, said non-superconducting filter having an input for receiving RF signals, an output, a housing, and more than three resonators, said resonators being enclosed in the housing such that the input of the non-superconducting filter is coupled to one of the resonators, and the output of the non-superconducting filter is coupled to another one of the resonators, wherein the non-superconducting filter is a bandpass filter having a first pass band;

a superconducting filter, said superconducting filter having an input coupled to the output of the non-superconducting filter, and an output; and a receiver coupled to the output of the superconducting filter.

* * * * *